United States Patent [19]
Mazzochette

[11] Patent Number: 5,920,241
[45] Date of Patent: Jul. 6, 1999

[54] PASSIVE TEMPERATURE COMPENSATING LC FILTER

[75] Inventor: Joseph B. Mazzochette, Cherry Hill, N.J.

[73] Assignee: EMC Technology LLC, Cherry Hill, N.J.

[21] Appl. No.: 08/856,056

[22] Filed: May 12, 1997

[51] Int. Cl.$^6$ .............................. H03H 7/01; H03H 7/19
[52] U.S. Cl. ..................... 333/174; 333/171; 333/184
[58] Field of Search .................................. 333/138–140, 333/156, 161, 170, 171, 184, 185, 174; 336/200; 361/274.1, 282

[56] References Cited

U.S. PATENT DOCUMENTS

| | | | |
|---|---|---|---|
| 3,421,121 | 1/1969 | Burnsweig, Jr. et al. | 333/171 |
| 4,881,050 | 11/1989 | Swanson, Jr. | 333/184 X |
| 4,939,779 | 7/1990 | Hitchcock | 380/7 |
| 5,032,815 | 7/1991 | Kobayashi et al. | 336/200 X |
| 5,157,576 | 10/1992 | Takaya et al. | 333/185 X |
| 5,175,518 | 12/1992 | Swanson, Jr. | 333/184 X |
| 5,532,656 | 7/1996 | Yoshimura | 336/200 X |
| 5,583,470 | 12/1996 | Okubo | 333/185 |
| 5,638,252 | 6/1997 | Drab et al. | 361/321.1 |

*Primary Examiner*—Seungsook Ham
*Attorney, Agent, or Firm*—Donald S. Cohen

[57] ABSTRACT

A phase shifter in which the change in phase changes with changes in temperature. The phase shifter includes a plurality of capacitors and inductors connected in series relation to form a filter network. Each of the capacitors has a dielectric material with a temperature coefficient so that the capacitance of the capacitor varies with temperature. Each of the inductors has a ferrite material which has a temperature coefficient so that the inductance of the inductor varies with temperature. The temperature coefficients of the dielectric material of the capacitors and the ferrite material of the inductors have the same sign, i.e, either negative or positive, and preferably are of the same value.

10 Claims, 6 Drawing Sheets

PASSIVE TEMPERATURE COMPENSATING LC FILTER

FIELD OF THE INVENTION

The present invention relates to a temperature compensated phase shifter, and, more particularly, to a phase shifter in which the phase variation provided by the shifter remains substantially constant with changes in temperature.

BACKGROUND OF THE INVENTION

Many RF and microwave systems rely on accurate phase control to insure proper circuit performance. Many devices used in these systems do not have temperature invariant phase characteristics. The phase temperature variation can be large enough to degrade the system to the point where compensation is required. One type of phase shifter is an allpass filter network formed of a plurality of capacitors and inductors connected in series and parallel relation. The amplitude of a signal which passes through such a filter remains unchanged regardless of the signal frequency. However, the phase will change with frequency depending upon the center frequency (or resonant frequency) of the filter. FIG. 1 is a graph showing a typical amplitude and phase response through an allpass filter. The dash line shows that the amplitude remains substantially constant over a range of frequencies whereas the solid line shows that the phase changes with frequency. The phase change with frequency is most linear around the 180° phase shift point. The 180° point is the most useful operation point for the filter, although other points may be used in order to achieve a particular slope or to match the characteristics of the system or device that is to be compensated. However, the variation in phase will change with changes in temperature.

SUMMARY OF THE INVENTION

A phase shifter includes a plurality of capacitors and inductors connected in series and parallel to form a filter network. Each of the capacitors has a capacitance which varies with temperature. Each of the inductors has an inductance which varies with temperature. The temperature change affecting both the capacitors and the inductors by the same sign, i.e. either positively or negatively.

DETAILED DESCRIPTION

Figure 1:
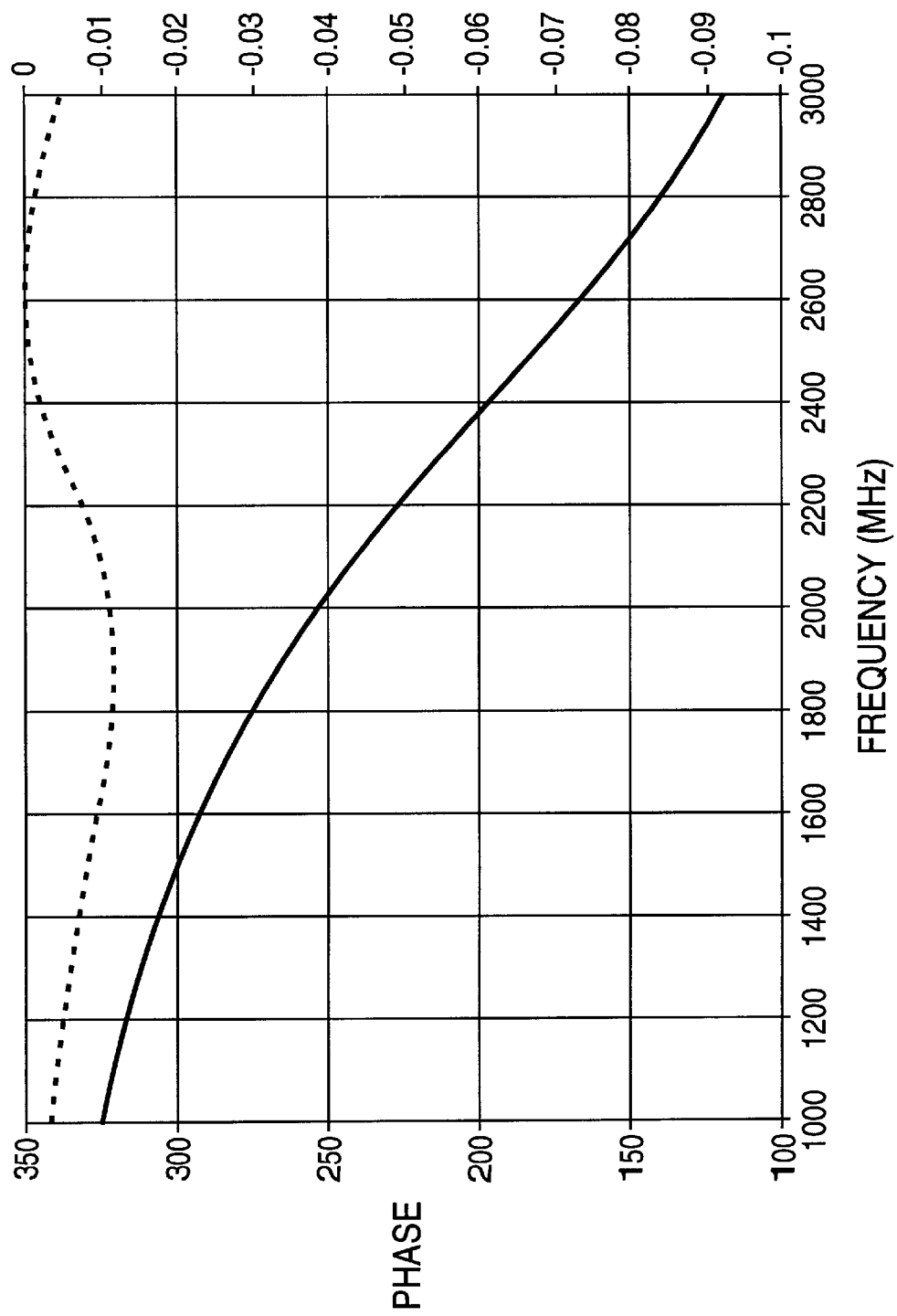
FIG. 1 is a graph showing the amplitude and phase response with frequency of a typical filter.
Figure 2:
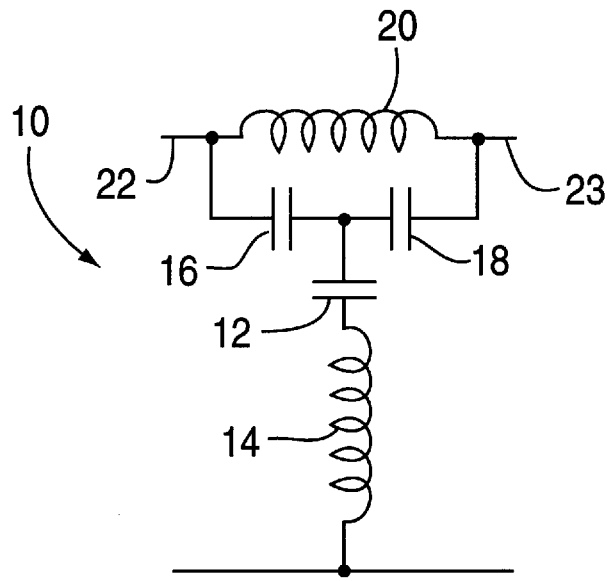
FIG. 2 is a circuit diagram of one type of an allpass filter phase shifter network which can incorporate the present invention.

Referring initially to FIG. 2, there is shown a form of a all pass filter 10 which can incorporate the present invention. The filter 10 comprises a low pass section form of a capacitor 12 and an inductor 14 electrically connected in series, and a high pass section formed of a pair of capacitors 16 and 18 connected in series with an inductor 20 having one end connected to a point between the capacitors 16 and 18. The high pass portion is connected in series with the low pass portion. Input and output terminals 22 and 23 are connected to the low pass portion between the capacitor 12 and the inductor 14. The filter 10 is designed with cutoff frequencies for each section to overlap at any desired center frequency. The overlap allows all frequencies to pass while producing a 360° phase shift. However, the phase shift will vary with variations in temperature of the circuit.

In accordance with the present invention, the changes in phase of the circuit to be compensated with respect to changes in temperature can be optimized for a particular application by constructing the filter using components, capacitors and inductors, of temperature sensitive materials. These materials change their properties in such a way as to produce a change in the center frequency of the filter while maintaining the room temperature characteristic impedance of the filter. As the center frequency of the filter changes, the phase shift of a signal passing through the filter at a given frequency will change. The phase shift can be predicted and the filter can be designed to produce a specific amount of phase shift. The result is a device that can be tailored to compensate for undesired phase changes in a system as a result of changes in ambient or circuit temperature. The slope on the filter phase compensation can be either positive or negative by choosing materials with either increasing or decreasing temperature coefficients.

Figure 3:
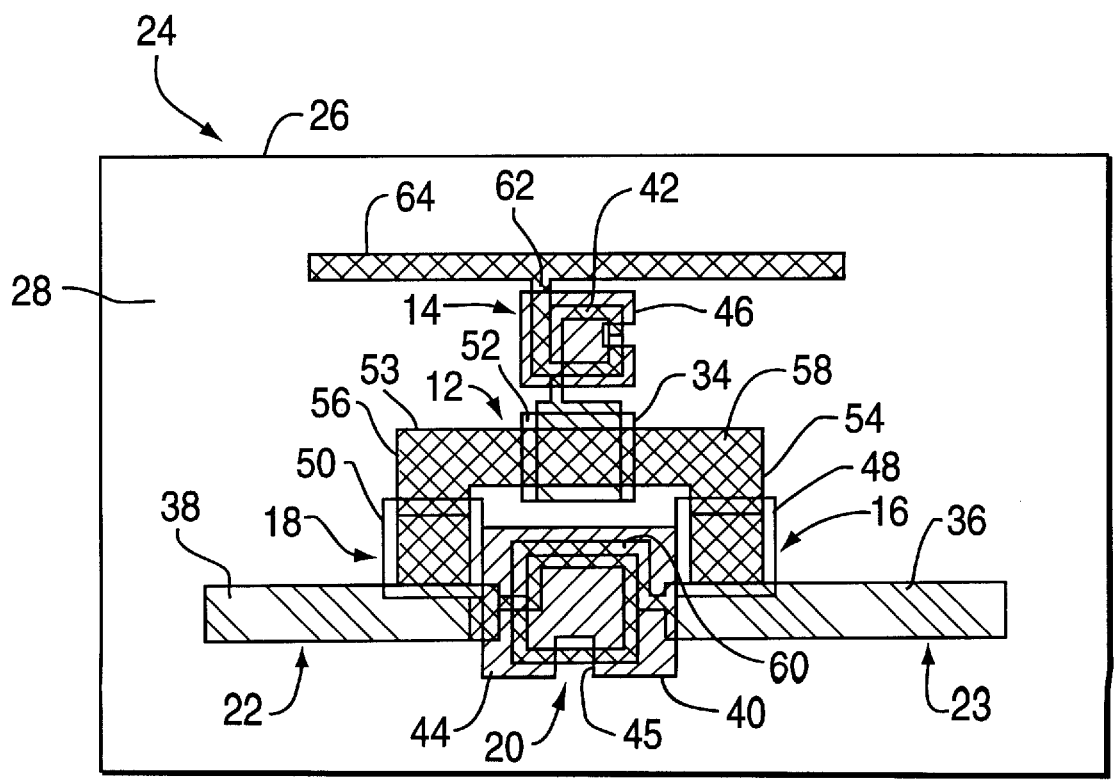
FIG. 3 is a top view of the circuit of FIG. 2 in printed circuit form.

To achieve the above result of optimizing the change in phase with changes in temperature in the circuit 10 shown in FIG. 3, the capacitors 12, 16 and 18, and the inductors 14 and 20 must increase in value to produce an increase in phase shift and must decrease in value to produce a decrease in phase shift. To achieve this in accordance with the present invention, the capacitors 12, 16 and 18 are constructed with a dielectric material whose permitivity varies with temperature, and the inductors 14 and 20 are made using a magnetic material whose permeability varies with temperature. In a capacitor, the capacitance of the capacitor is proportional to the permitivity of the dielectric material, and in an inductor, the inductance of the inductor is proportional to the permeability of the magnetic material. Therefore, the inductance and capacitance will change as the permeability and permitivity changes with temperature. Materials can be selected that have either positive or negative temperature coefficients for permitivity and permeability. However, all of the capacitors and inductors should be of materials having temperature coefficients of the same sign, i.e, either positive or negative. Also, it is preferable that all of the capacitors and inductors have temperature coefficients of substantially the same value.

Figure 7:
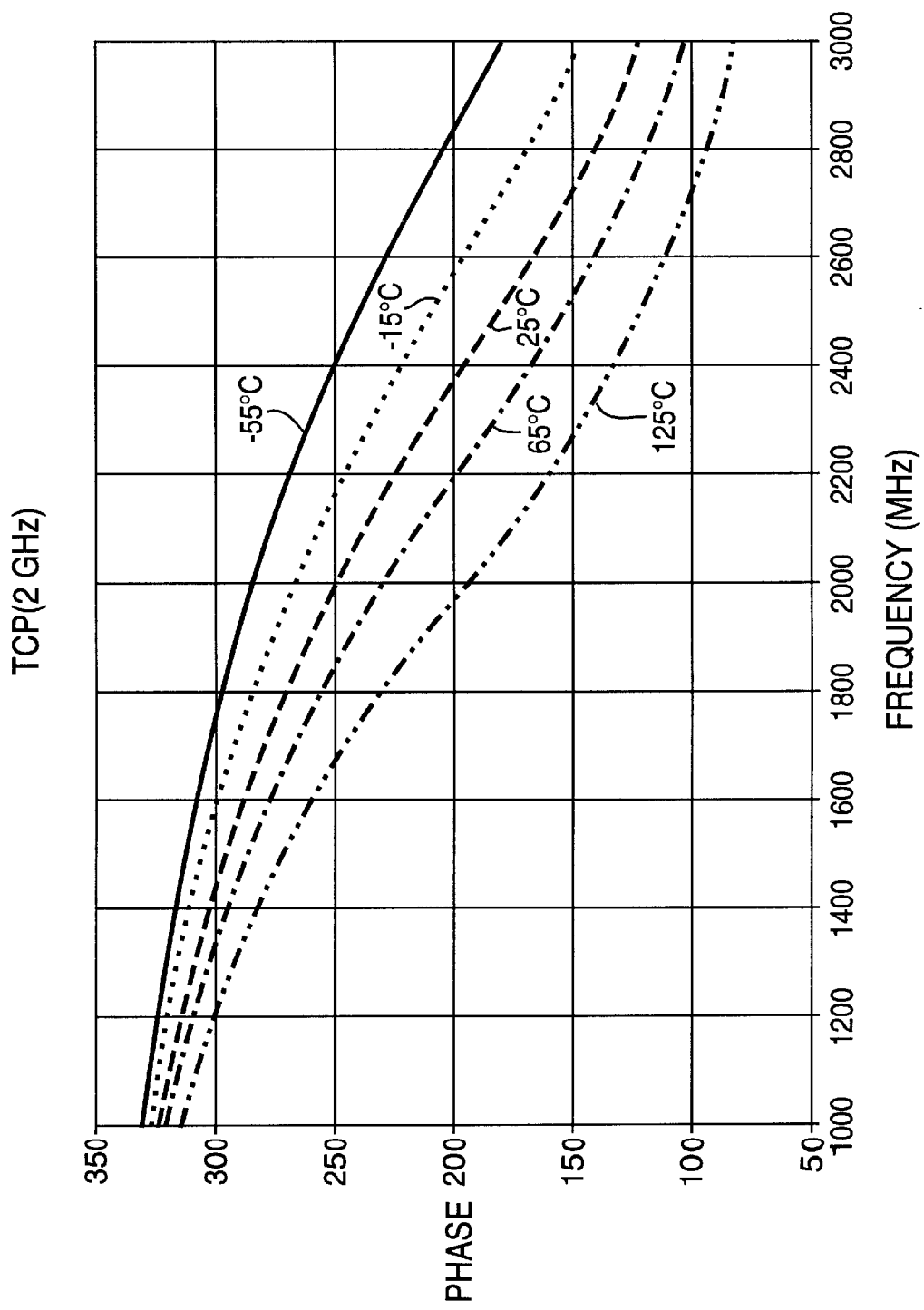
FIG. 7 is a graph showing the changes in phase with frequency at different temperatures for the filter of the present invention.
Figure 8:
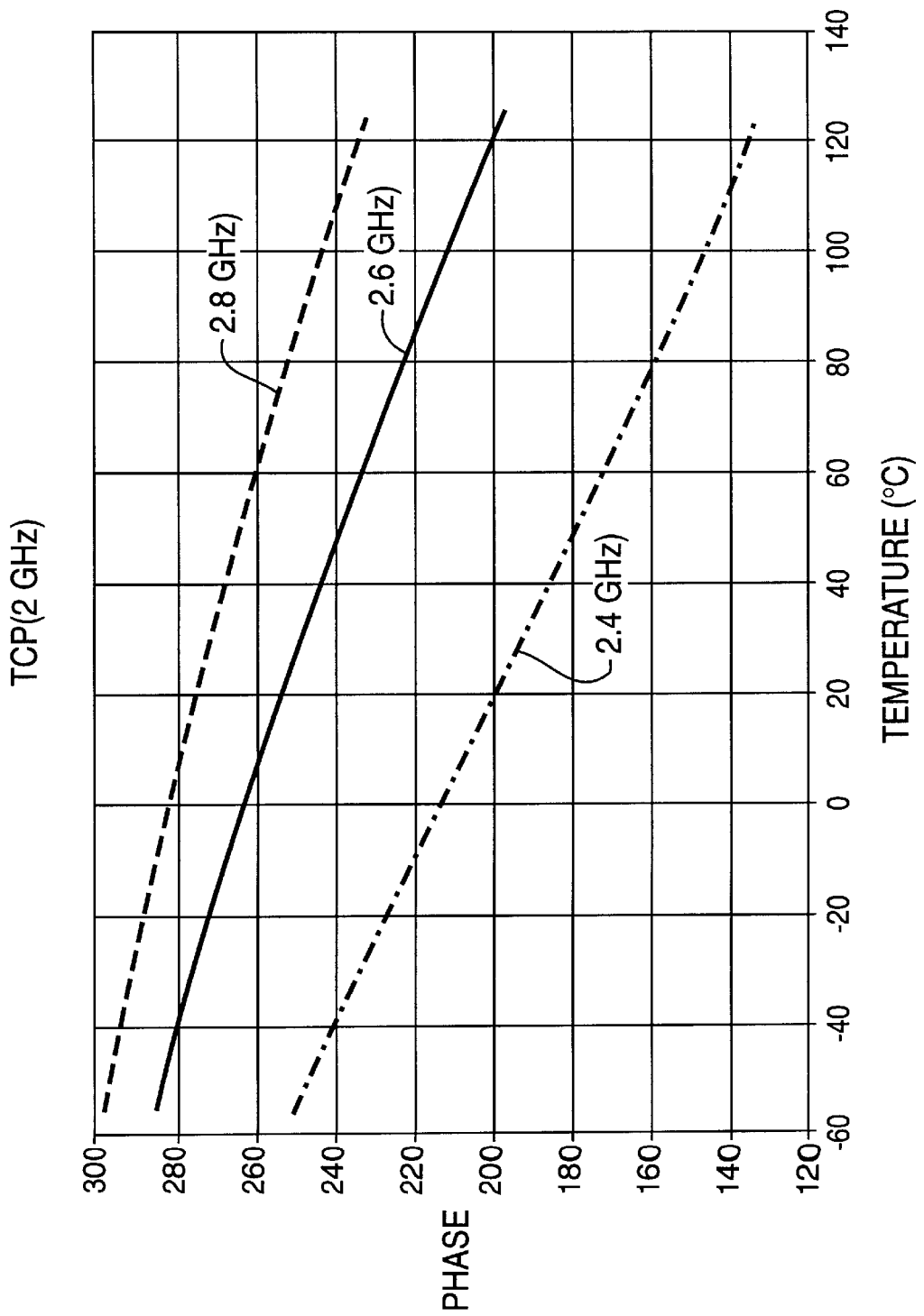
FIG. 8 is a graph showing the change in phase with changes in temperature for filter of the present invention operating at different frequencies.

The graph of FIG. 7 shows the response of an allpass filter 10 constructed with capacitors and inductors having dielectric and magnetic materials respectively with temperature coefficients of 2000ppm/°C. This device, while being operated at about 2.3 Ghz, produces a phase change of 120° from −55° C. to 125° C. FIG. 8 shows the change in phase as a function of temperature at four different frequencies near the center of the band. As is apparent in FIG. 8, the phase change is quite linear, particularly near the center frequency of operation. Thus, the present invention provides a filter in which the phase change remains substantially constant with changes in either the ambient or operating temperature of the system.

Figure 4:
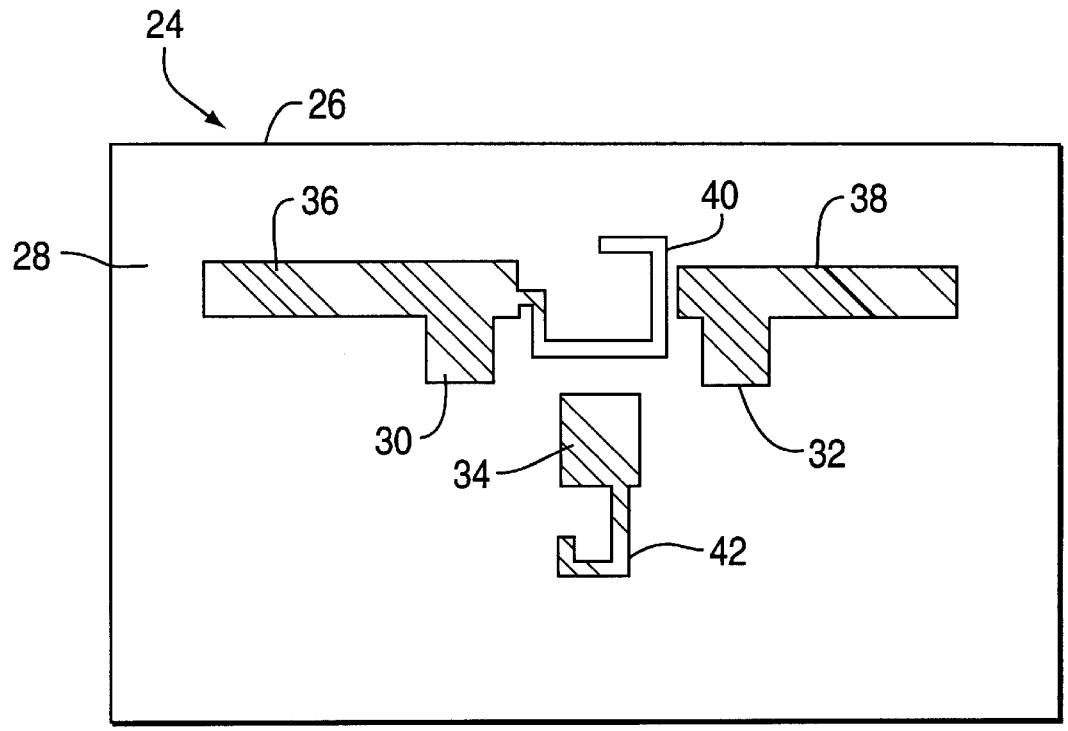
FIG. 4 is a top view showing the bottom layer of the device shown in FIG. 3.

Referring to FIG. 3, there is shown a printed circuit device 24 forming the filter circuit 10 shown in FIG. 2. The printed circuit device 24 comprises a substrate 26 of an insulating material, such as quartz or sapphire. On a surface 28 of the substrate 26 are layers of various materials which form the capacitors 12, 16, and 18, the inductors 14 and 20 and the interconnections therebetween. As shown in FIG. 4, directly on the surface 28 of the substrate 26 is a first layer, which is of a conductive metal which is defined to form a pair of spaced capacitor plates 30 and 32, each of which is one of the plates of the capacitors 16 and 18 respectively. Also, there is defined a capacitor plate 34 which is one of the plates of the capacitor 12. Interconnection strips 36 and 38 extend from each of the capacitor plates 30 and 32. Extending from the end of the interconnection strip 36 and in the space between the interconnection strips 36 and 38 is an inductance strip 40. The inductance strip 40 extends in a rectangular pattern but is not completely closed. Extending from the capacitor plate 34 on the side away from the inductance strip 40 is another inductance strip 42. The inductance strip 42 also extends in a rectangular pattern but is not closed.

Figure 5:
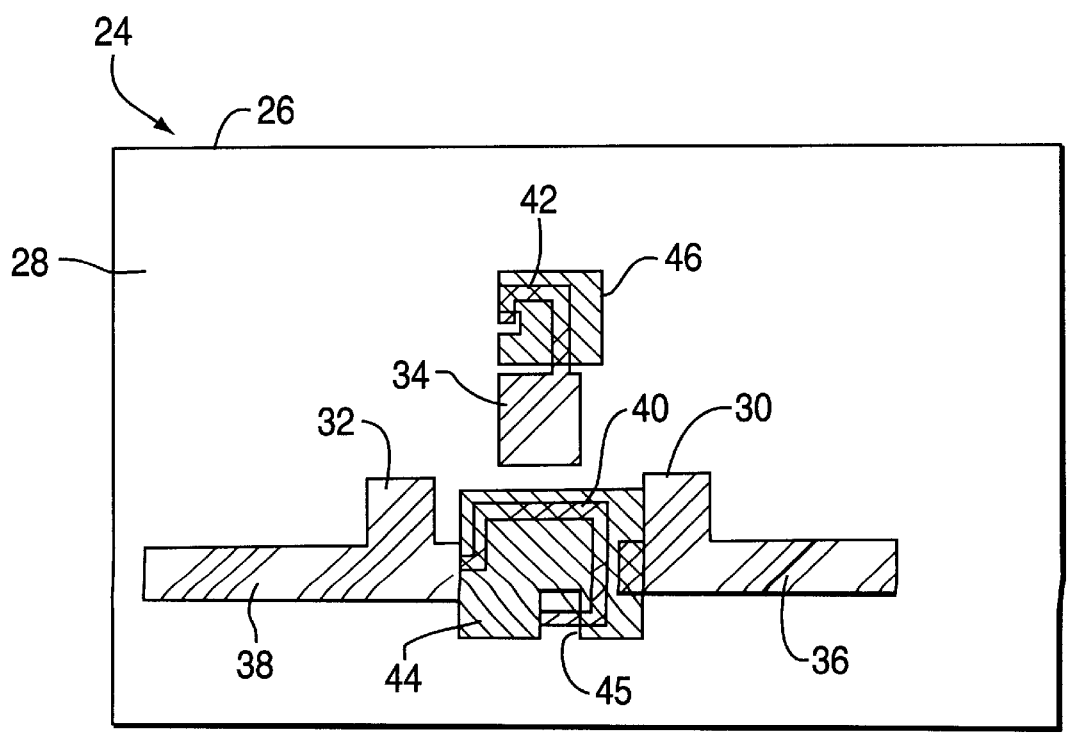
FIG. 5 is a top view showing the device shown in FIG. 4 with a second layer thereon.
Figure 6:
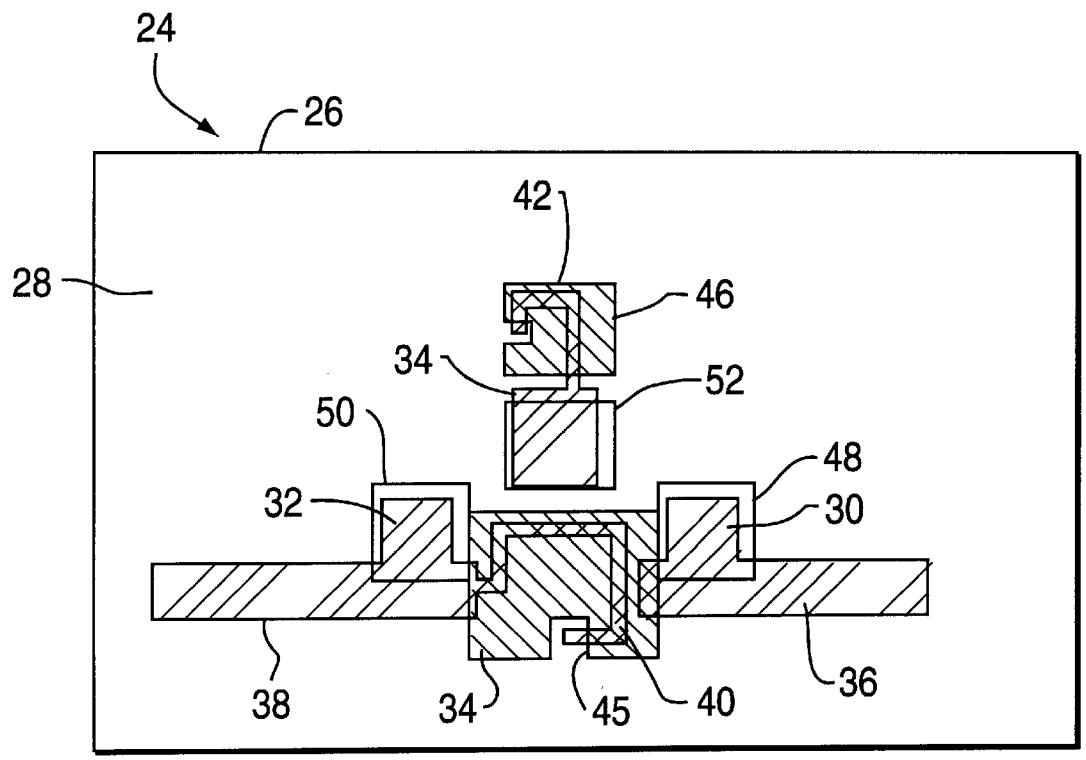
FIG. 6 is a top view showing the device showing in FIG. 5 with a third layer thereon.

Referring to FIG. 5, there is shown a second layer which is over portions of the first layer and which is of a ferrite material having a desired negative or positive temperature coefficient. The second layer is defined to form a first region 44 which is over the inductance strip 40, and a second region 46 which is over the second inductance strip 42. The first ferrite region 44 has a notch 45 in one edge which exposes the free end of the inductance strip 36. Referring to FIG. 6, there is shown a third layer which is over portions of the first layer and which is of a dielectric material having a desired negative or positive temperature coefficient. The third layer is defined to form regions 48, 50 and 52 which are over the capacitor plates 30, 32 and 34 respectively. As shown in FIG. 3, a fourth layer, which is of a conductive metal, is on the substrate surface 28.

The fourth layer is defined to form a U-shaped strip 53 having arms 54 and 56 which extend over the dielectric regions 48 and 50 and a base 58 which extends over the dielectric region 52. Thus, the U-shaped strip 52 extends over the capacitor plates 30, 32 and 34 to form the other plate of each of the capacitors 12, 16 and 18. The fourth layer is also defined to form an inductance strip 60 which is over the ferrite region 44. The inductance strip 60 extends in a rectangular path and has one end extending over the notch 45 in the ferrite region 44 and contacting the free end of the inductance strip 40. The other end of the inductance strip 60 extends over and contacts the interconnecting strip 38. Thus, the inductance strips 40 and 60 and the ferrite region 44 forms the inductor 20 which is in parallel with the capacitors 16 and 18. The fourth layer is also defined to form an inductance strip 62 which is over the ferrite region 46 and extends in a rectangular path. One end of the inductance strip 62 extends through an opening (not shown) in the ferrite region 46 and contacts the end of the inductance strip 42. The other end of the inductance strip 62 is connected to an interconnecting strip 64 which extends along the substrate surface 28. Thus, the inductance strips 42 and 62 and the ferrite region 46 forms the inductor 14 which is connected in series with the capacitor 12.

In the device 24, the capacitor 12 is formed by the capacitor plate 34, dielectric region 52 and the base 58 of the U-shaped strip 53. The capacitor 12 is electrically connected in series with the inductor 14 which is formed by the inductance strips 42 and 62 and the ferrite region 46. The capacitor 16 is formed by the capacitor plate 30, dielectric region 48 and the arm 54 of the U-shaped strip 53, and the capacitor 18 is formed by the capacitor plate 32, dielectric region 50, and the arm 56 of the U-shaped strip 53. The capacitors 16 and 18 are electrically connected in series by the U-shaped strip 53. The inductor 20 is formed by the inductor strips 40 and 60 and the ferrite region 44. The inductor 20 is electrically connected between the interconnecting strips 36 and 38 so as to be electrically connected in parallel with the capacitors 16 and 18. The interconnecting strips 36 and 38 are also the terminals 22 and 23. The various layers of the device 24 are applied to the surface 28 of the substrate 26 by screen printing or spraying and then fired at high temperatures (typically about 850° C.) ti fuse the material to the surface of the substrate.

Figure 9A:
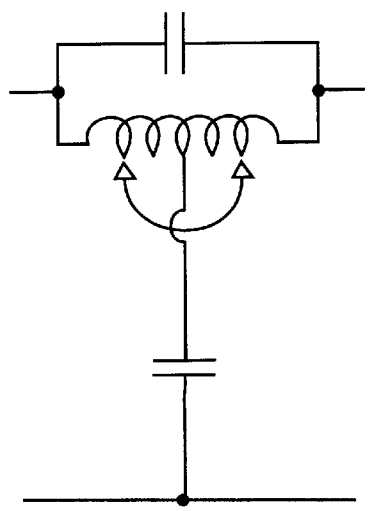
FIGS. 9a and 9b are circuit diagrams of other filter circuits which can incorporate the present invention.
Figure 9B:
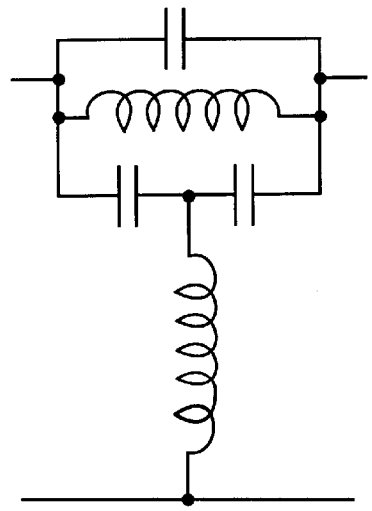

The present invention can be applied to filters of different circuit designs, which filters are formed of capacitors and inductors connected together in series and parallel relation. FIGS. 9a and 9b show other circuit arrangements which can incorporate the present invention. In each of these circuits, the capacitors are made with dielectric materials which have either a negative or positive temperature coefficient, and the inductors are made with ferrite materials which also have either a negative or positive temperature coefficient. All of the components are made with materials having temperature coefficients of the same sign, so that all are either negative or positive. Also, it is preferable that the temperature coefficients of all the components have substantially the same value.

Thus, there is provided by the present invention a phase shifter in which a change in phase remains substantially constant with changes in either the ambient or operating temperature of the device. This temperature compensation is achieved by making the capacitors and inductors which form the phase shifter of materials, such as the dielectric material of the capacitors and the ferrite materials of the inductors, having a temperature coefficient. The materials should have a temperature coefficient of the same sign, i.e, either positive or negative, and preferably should have substantially the same value.

What is claimed is:

1. A filter comprising:
   a plurality of capacitors and inductors electrically connected in series and parallel relation to form a filter network;
   each of said capacitors having a capacitance which varies with temperature; and
   each of said inductors having an inductance which varies with temperature;
   the change in capacitance of all of the capacitors and the change in the inductance of all of the inductors with a change in temperature being of the same sign.

2. The filter in accordance with claim 1 wherein each of the capacitors comprises a pair of plates with a dielectric material therebetween, and the dielectric material has a temperature coefficient so that the capacitor varies in capacitance with changes in temperature.

3. The filter in accordance with claim 2 wherein each of the inductors comprises a coil and a ferrite material adjacent the coil, the ferrite material having a temperature coefficient so that the inductance of the inductor varies with temperature.

4. The filter in accordance with claim 3 wherein the temperature coefficient of each of the capacitors and inductors is of substantially the same value.

5. A filter comprising:

a substrate of an insulating material having a surface;

a plurality of layers of a conductive metal on the surface of the substrate, said metal layers being in the form of a plurality of sets of overlapping capacitor plate regions and a plurality of inductor coil strips;

a layer of a dielectric material between the capacitor plate regions of each set, said dielectric material having a temperature coefficient of one sign; and a layer of a ferrite material adjacent each of the inductor coil strips, said ferrite material having a temperature coefficient of the one sign.

6. The filter in accordance with claim 5 in which the dielectric material and the ferrite material all have a temperature coefficient which is either negative or positive.

7. The filter in accordance with claim 6 including first and second conductive metal layers;

the first metal layer is on the substrate surface and is in the form of a plurality of the capacitor plate regions and portion of a plurality of the inductor coil strips;

the second metal layer is over the surface of the substrate and is in the form of a plurality of the capacitor plate regions each of which overlaps a separate capacitor plate region of the first layer, and portion of a plurality of the inductor coil strips each of which is electrically connected to a separate inductor coil strip of the first metal layer.

8. The filter in accordance with claim 7 in which the layer of ferrite material is in the form of separate region each of which is between at least portions of the inductor coil strips of the first and second metal layers.

9. The filter in accordance with claim 8 in which the dielectric layer is in separate regions each of which is between overlapping capacitor plate region of the first and second metal layers.

10. The filter in accordance with claim 9 including interconnect strips of a conductive metal on the substrate surface and electrically connecting the capacitor plate regions and inductor coil strips.

* * * * *